US009922833B2

(12) United States Patent
Ramsbey et al.

(10) Patent No.: US 9,922,833 B2
(45) Date of Patent: Mar. 20, 2018

(54) CHARGE TRAPPING SPLIT GATE EMBEDDED FLASH MEMORY AND ASSOCIATED METHODS

(71) Applicant: Cypress Semiconductor Corporation, San Jose, CA (US)

(72) Inventors: Mark Ramsbey, Sunnyvale, CA (US); Chun Chen, San Jose, CA (US); Sameer Haddad, San Jose, CA (US); Kuo Tung Chang, Saratoga, CA (US); Unsoon Kim, San Jose, CA (US); Shenqing Fang, Fremont, CA (US); Yu Sun, Saratoga, CA (US); Calvin Gabriel, Cupertino, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 0 days.

(21) Appl. No.: 14/971,531

(22) Filed: Dec. 16, 2015

(65) Prior Publication Data
US 2016/0111292 A1 Apr. 21, 2016

Related U.S. Application Data

(62) Division of application No. 13/715,582, filed on Dec. 14, 2012, now abandoned.

(51) Int. Cl.
*H01L 29/792* (2006.01)
*H01L 21/28* (2006.01)
(Continued)

(52) U.S. Cl.
CPC .. *H01L 21/28282* (2013.01); *H01L 21/31144* (2013.01); *H01L 21/32139* (2013.01);
(Continued)

(58) Field of Classification Search
CPC ............ H01L 21/8238; H01L 27/0922; H01L 27/11807; H01L 2027/11807;
(Continued)

(56) References Cited

U.S. PATENT DOCUMENTS

| 5,824,584 A | 10/1998 | Chen et al. |
| 5,969,383 A | 10/1999 | Chang et al. |

(Continued)

FOREIGN PATENT DOCUMENTS

| JP | 2004303918 A | 10/2004 |
| JP | 2007305711 A | 11/2007 |

(Continued)

OTHER PUBLICATIONS

U.S. Appl. No. 13/715,582: "Charge Trapping Split Gate Embedded Flash Memory and Associated Methods," Mark Ramsbey et al., filed Dec. 14, 2012; 46 pages.
(Continued)

*Primary Examiner* — Moin Rahman

(57) ABSTRACT

Semiconductor devices and methods of manufacturing such devices are described herein. According to embodiments, the semiconductor device can be made by forming a dielectric layer at a first region and at a second region of a semiconductor substrate. A gate conductor layer is disposed over the dielectric formed in the first and the second regions of the semiconductor substrate, and the second region is masked. A split gate memory cell is formed in the first region of the semiconductor substrate with a first gate length. The first region is then masked, and the second region is etched to define a logic gate that has a second gate length. The first and second gate lengths can be different.

18 Claims, 14 Drawing Sheets

(51) Int. Cl.
| | |
|---|---|
| *H01L 29/66* | (2006.01) |
| *H01L 27/11573* | (2017.01) |
| *H01L 29/423* | (2006.01) |
| *H01L 21/311* | (2006.01) |
| *H01L 21/3213* | (2006.01) |
| *H01L 27/11568* | (2017.01) |

(52) U.S. Cl.
CPC .. *H01L 27/11568* (2013.01); *H01L 27/11573* (2013.01); *H01L 29/42344* (2013.01); *H01L 29/42372* (2013.01); *H01L 29/66833* (2013.01); *H01L 29/792* (2013.01)

(58) Field of Classification Search
CPC ........... H01L 21/76897; H01L 21/8224; H01L 21/8228; H01L 21/8234; H01L 21/823885; H01L 29/0847; H01L 29/42316; H01L 29/42384; H01L 29/66; H01L 21/28282; H01L 21/28; H01L 21/31144; H01L 29/42372; H01L 29/42344; H01L 29/66833; H01L 29/423; H01L 29/792; H01L 29/66; H01L 27/11568; H01L 27/11573; H01L 27/115
USPC ......... 257/29, 324, 314–316, 365, 311, 303; 438/136, 137, 156, 173, 192, 206, 212, 438/424, 427, 428, 591
See application file for complete search history.

(56) References Cited

U.S. PATENT DOCUMENTS

| | | | |
|---|---|---|---|
| 6,972,997 B2 | 12/2005 | Ishimaru et al. | |
| 7,057,230 B2 | 6/2006 | Tanaka et al. | |
| 7,115,943 B2 | 10/2006 | Mine et al. | |
| 7,235,441 B2 | 6/2007 | Yasui et al. | |
| 7,371,631 B2 | 5/2008 | Sakai et al. | |
| 7,414,283 B2 | 8/2008 | Tanaka et al. | |
| 7,504,689 B2 | 3/2009 | Hisamoto et al. | |
| 7,557,005 B2 | 7/2009 | Ishii et al. | |
| 7,663,176 B2 | 2/2010 | Sakai et al. | |
| 7,667,259 B2 | 2/2010 | Yasui et al. | |
| 7,700,992 B2 | 4/2010 | Tanaka et al. | |
| 7,723,779 B2 | 5/2010 | Hisamoto et al. | |
| 7,863,135 B2 | 1/2011 | Sakai et al. | |
| 7,863,670 B2 | 1/2011 | Ishii et al. | |
| 8,017,986 B2 | 9/2011 | Tanaka et al. | |
| 8,125,012 B2 | 2/2012 | Mine et al. | |
| 2002/0098649 A1* | 7/2002 | Chien | H01L 21/82383 438/258 |
| 2005/0136632 A1 | 6/2005 | Rotondaro et al. | |
| 2007/0228498 A1* | 10/2007 | Toba | H01L 21/28282 257/411 |
| 2007/0262382 A1* | 11/2007 | Ishii | H01L 27/105 257/350 |
| 2008/0203466 A1 | 8/2008 | Sakai et al. | |
| 2008/0265309 A1 | 10/2008 | Higashi et al. | |
| 2009/0256193 A1 | 10/2009 | Ishii et al. | |
| 2009/0273013 A1* | 11/2009 | Winstead | H01L 27/11526 257/315 |
| 2010/0029052 A1* | 2/2010 | Kang | B82Y 10/00 438/261 |
| 2010/0052034 A1* | 3/2010 | Cheng | H01L 29/7881 257/316 |
| 2010/0099246 A1* | 4/2010 | Herrick | B82Y 10/00 438/591 |
| 2010/0200909 A1 | 8/2010 | Kawashima et al. | |
| 2011/0039385 A1 | 2/2011 | Shimamoto et al. | |
| 2011/0211396 A1 | 9/2011 | Takeuchi | |

FOREIGN PATENT DOCUMENTS

| | | |
|---|---|---|
| JP | 2010258091 A | 11/2010 |
| JP | 2011014920 A | 1/2011 |
| JP | 2011040782 A | 2/2011 |
| KR | 20110075952 A | 7/2011 |

OTHER PUBLICATIONS

International Search Report for International Application No. PCT/US2013/074386 dated Mar. 27, 2014; 2 pages.
Ito, F. et al., "A Novel MNOS Technology Using Gate Hole Injection in Erase Operation for Embedded Nonvolatile Memory Applications," 80-81, Symposium on VLSI Technology, Digest of Technical Papers, Renesas Technology Corporation, 2004.
Matsubara, K., et al., "Highly Reliable 10ns MONOS Flash," elmicro.com/files/renesas/monos_flash_ewe_2008_for_proceedings.pdf, Renesas Technology/Europe GmbH, 2008.
Tanaka, T., et al., "Hitachi, A 512kB MONOS type Flash Memory Module Embedded in a Micro Controller," 211-212, Symposium on VLSI Circuits, Digest of Technical Papers, Semiconductor & Integrated Circuits, Hitachi, Ltd., 2003.
Tsuji, Y. et al., "New Degradation Mode of Program Disturb Immunity of Sub-90nm Node Split-Gate SONOS Memory," 699-700, Reliability Physics Symposium, IEEE International, IRPS, Device Platforms Research Laboratories, NEC Corporation, 2008.
USPTO Final Rejection for U.S. Appl. No. 13/715,582 dated Feb. 26, 2014; 10 pages.
USPTO Final Rejection for U.S. Appl. No. 13/715,582 dated Jul. 16, 2015; 11 pages.
USPTO Non-Final Rejection for U.S. Appl. No. 13/715,582 dated Jan. 20, 2015; 11 pages.
USPTO Non-Final Rejection for U.S. Appl. No. 13/715,582 dated Nov. 6, 2013; 8 pages.
USPTO Requirement for Restriction for U.S. Appl. No. 13/715,582 dated Oct. 2, 2013; 7 pages.
Written Opinion of the International Searching Authority for International Application No. PCT/US2013/074386 dated Mar. 27, 2014; 4 pages.
Yanagi, I., et al., "Quantum confinement effect of efficient hole injection in MONOS-type nonvolatile memory-the role of ultrathin i-Si/P+ poly-Si stacked gate structure fabricated by laser spike annealing," 146-147, Symposium on VSLI Technology, Digest of Technical Papers, Central Research Laboratory, Hitachi Ltd., 2007.
Japanese Exam Report for Japanese Application No. 2015-547495 dated Dec. 18, 2017; 12 pages.

* cited by examiner

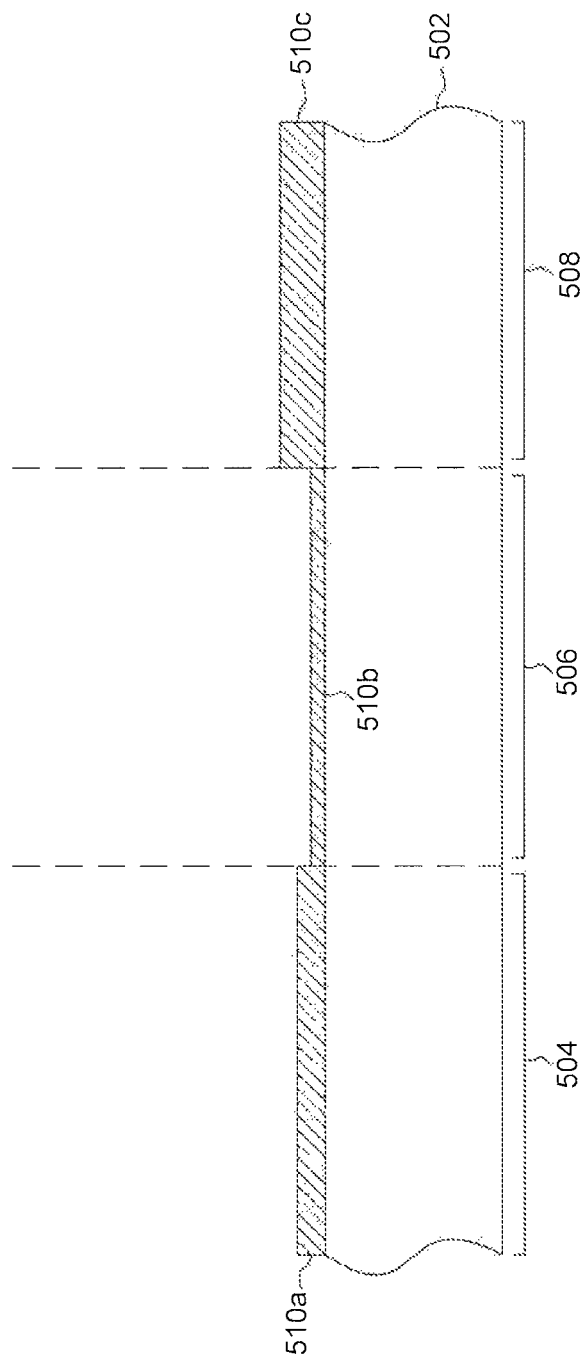

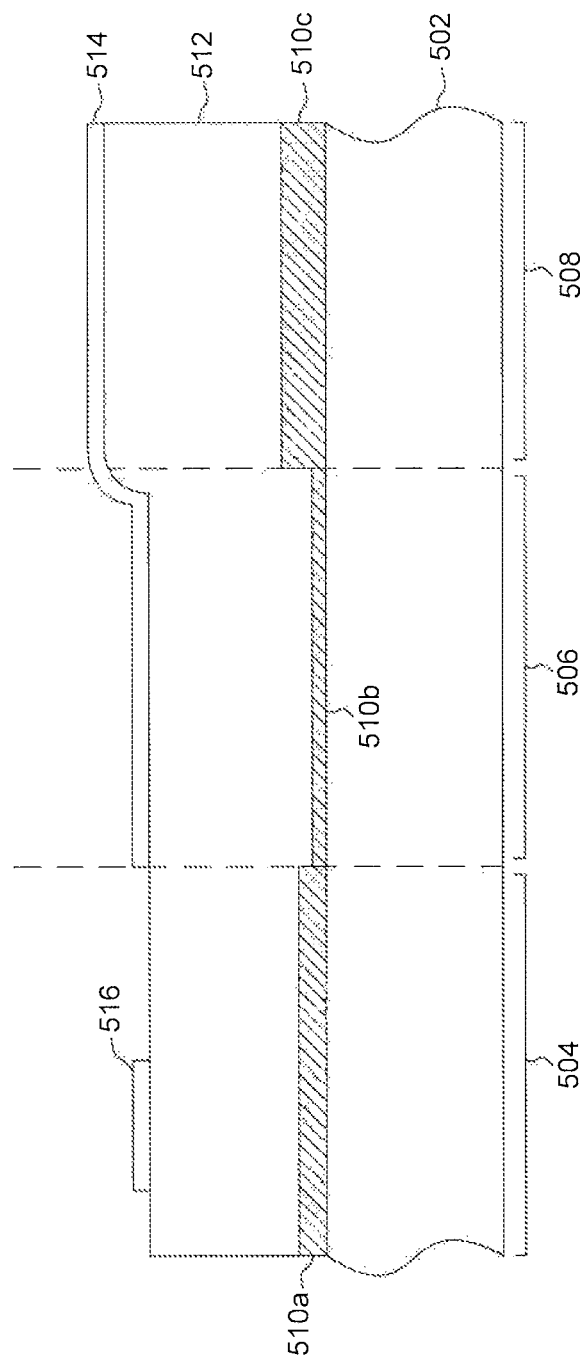

CHARGE TRAPPING SPLIT GATE EMBEDDED FLASH MEMORY AND ASSOCIATED METHODS

CROSS-REFERENCE TO RELATED APPLICATION

This application is a divisional of U.S. application Ser. No. 13/715,582, filed Dec. 14, 2012, currently pending, titled "Charge Trapping Split Gate Embedded Flash Memory and Associated Methods," which is incorporated herein by reference in its entirety.

BACKGROUND

Technical Field

This disclosure relates generally to improved embedded semiconductor products and methods and apparatus for making such semiconductor products.

Related Art

A non-volatile memory, such as Flash memory, retains stored data even if power to the memory is removed. A non-volatile memory cell stores data, for example, by storing electrical charge in an electrically isolated floating gate or in a charge-trapping layer underlying a control gate of a field-effect transistor (FET). The stored electrical charge controls the threshold of the FET, thereby controlling the memory state of the cell.

A non-volatile memory cell is programmed using, for example, hot carrier injection to place charge into a storage layer. High drain and gate voltages are used to facilitate the programming process, and the memory cell conducts relatively high current during programming, which can be undesirable in low voltage or low power application.

A split-gate memory cell is a type of non-volatile memory cell, in which a select gate is placed adjacent a memory gate. During programming of a split-gate memory cell, the select gate is biased at a relatively low voltage, and only the memory gate is biased at the high voltage to provide the vertical electric field necessary for hot-carrier injection. Since acceleration of the carriers takes place in the channel region mostly under the select gate, the relatively low voltage on the select gate results in more efficient carrier acceleration in the horizontal direction compared to a conventional Flash memory cell. That makes hot-carrier injection more efficient with lower current and lower power consumption during programming operation. A split-gate memory cell may be programmed using techniques other than hot-carrier injection, and depending on the technique, any advantage over the conventional Flash memory cell during programming operation may vary.

Fast read time is another advantage of a split-gate memory cell. Because the select gate is in series with the memory gate, the erased state of the memory gate can be near or in depletion mode (i.e., threshold voltage, Vt, less than zero volt). Even when the erased memory gate is in such depletion mode, the select gate in the off state prevents the channel from conducting substantial current. With the threshold voltage of the erased state near or below zero, the threshold voltage of the programmed state does not need to be very high while still providing a reasonable read margin between erased and programmed states. Accordingly, the voltages applied to both select gate and memory gate in read operation can be less than or equal to the supply voltage. Therefore, not having, to pump the supply voltage to a higher level makes the read operation faster.

It is common to monolithically incorporate multiple types of field-effect devices on the same substrate as memory cells. Those non-memory devices perform, for example, decoding, charge-pumping, and other functions, related to memory operations. The substrate may also include non-memory devices to provide functions that are not related to memory operations. Such non-memory devices incorporated on the same substrate as the memory cells may include transistors tailored for high-speed operations, while other transistors are tailored for handling high operating voltages. Integrating the processing of memory cells, such as a split-gate memory cell, with the processing of one or more types of non-memory transistors on the same substrate is challenging as each requires different fabrication parameters. Accordingly, there is a need for device and methods for integrating a memory cell and other devices on the same substrate to facilitate improved cost, performance, reliability, or manufacturability.

BRIEF SUMMARY OF THE INVENTION

A method of making a semiconductor device is provided according to aspects of the present disclosure. According to the method, an dielectric layer is formed at a first region and at a second region of a semiconductor substrate. A gate conductor layer is disposed over the dielectric formed in the first and the second regions of the semiconductor substrate, and the second region is masked. A split gate memory cell is formed in the first region of the semiconductor substrate with a first gate length. The first region is then masked, and the second region is etched to define a logic gate that has a second gate length.

A semiconductor device is provided according to aspects of the present disclosure. The semiconductor device includes a split gate memory cell having a first gate length and formed at a first region of a semiconductor substrate. A logic gate is formed in a second region of the semiconductor substrate and has a second gate length. Additionally, the first gate length is different from the second gate length.

Further features and advantages of embodiments of the invention, as well as the structure and operation of various embodiments of the invention, are described in detail below with reference to the accompanying drawings. It is noted that the invention is not limited to the specific embodiments described herein. Such embodiments are presented herein for illustrative purposes only. Additional embodiments will be apparent to a person skilled in the relevant art(s) based on the teachings contained herein.

BRIEF DESCRIPTION OF THE DRAWINGS/FIGS

Embodiments of the invention will now be described, by way of example only, with reference to the accompanying schematic drawings in which corresponding reference symbols indicate corresponding parts. Further, the accompanying drawings, which are incorporated herein and form part of the specification, illustrate embodiments of the present invention, and, together with the description, further serve to explain the principles of the invention and to enable a person skilled in the relevant art(s) to make and use the invention.

FIGS. 5A-5G depict a cross-section of a semiconductor device at various points during its manufacture according to various embodiments.

Figure 1:
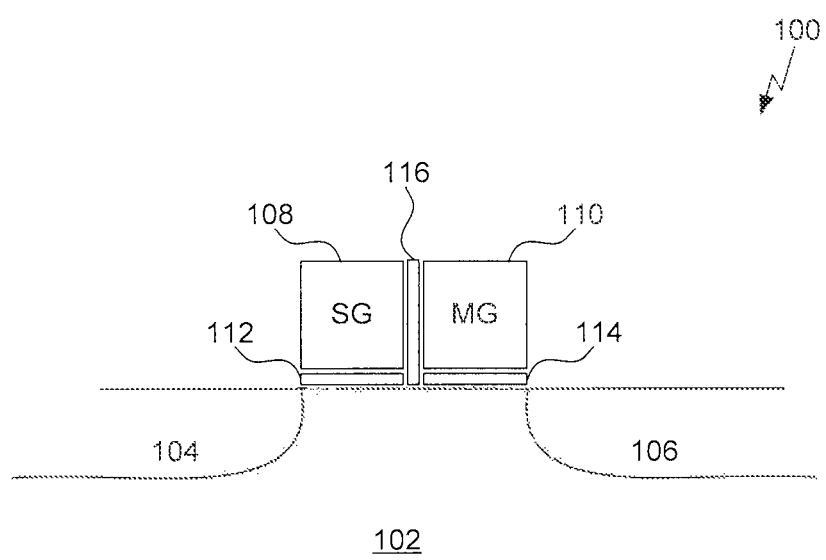
FIG. 1 depicts a cross-section of a split-gate memory cell according to various embodiments.

The features and advantages of embodiments of the present invention will become more apparent from the detailed description set forth below when taken in conjunction with the drawings. In the drawings, like reference numbers generally indicate identical, functionally similar, and/or structurally similar elements.

DETAILED DESCRIPTION OF THE INVENTION

This specification discloses one or more embodiments that incorporate the features of this invention. The disclosed embodiment(s) merely exemplify the present invention. The scope of the present invention is not limited to the disclosed embodiment(s). The present invention is defined by the claims appended hereto.

The embodiment(s) described, and references in the specification to "one embodiment," "an embodiment," "an example embodiment," etc., indicate that the embodiment(s) described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is understood that it is within the knowledge of one skilled in the art to effect such feature, structure, or characteristic in connection with other embodiments whether or not explicitly described.

Before describing the various embodiments in more detail, further explanation shall be given regarding certain terms that may be used throughout the descriptions.

The term "etch" or "etching" is used herein to generally describe a fabrication process of patterning a material, such that at least a portion of the material remains after the etch is completed. For example, it should be understood that the process of etching silicon involves the steps of patterning a masking layer (e.g., photoresist or a hard mask) above the silicon, and then removing the areas of silicon no longer protected by the masking layer. As such, the areas of silicon protected by the mask would remain behind after the etch process is complete. However, in another example, etching may also refer to a process that does not use a mask, but still leaves behind at least a portion of the material after the etch process is complete.

The above description serves to distinguish the term "etching" from "removing." When etching a material, at least a portion of the material remains behind after the process is completed. In contrast, when removing a material, substantially all of the material is removed in the process. However, in some embodiments, 'removing' is considered to be a broad term that may incorporate etching.

During the descriptions herein, various regions of the substrate upon which the field-effect devices are fabricated are mentioned. It should be understood that these regions may exist anywhere on the substrate and furthermore that the regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

The terms "forming," "form," "deposit," or "dispose" are used herein to describe the act of applying a layer of material to the substrate. Such terms are meant to describe any possible layer-forming technique including, but not limited to, thermal growth, sputtering, evaporation, chemical vapor deposition, epitaxial growth, electroplating, etc. According to various embodiments, for instance, deposition may be performed according to any appropriate well-known method. For instance, deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

The "substrate" as used throughout the descriptions is most commonly thought to be silicon. However, the substrate may also be any of a wide array of semiconductor materials such as germanium, gallium arsenide, indium phosphide, etc. In other embodiments, the substrate may be electrically non-conductive such as a glass or sapphire wafer.

As used herein, "mask" may comprise any appropriate material that allows for selective removal (e.g., etching) of an unmasked portion a material. According to some embodiments, masking structures may comprise a photoresist such as Poly(methyl methacrylate) (PMMA), Poly(methyl glutarimide) (PMGI), a Phenol formaldehyde resin, a suitable epoxy, etc.

Before describing such embodiments in more detail, it is instructive to present an example memory cell and environment in which the present embodiments may be implemented.

FIG. 1 illustrates an example of a split-gate non-volatile memory cell 100. Memory cell 100 is formed on a substrate 102, such as silicon. Substrate 102 is commonly p-type or a p-type well while a first doped source/drain region 104 and a second doped source/drain region 106 are n-type. However, it is also possible for substrate 102 to be n-type while regions 104 and 106 are p-type.

Memory cell 100 includes two gates, a select gate 108 and a memory gate 110. Each gate may comprise a gate conductor such as a doped poly layer formed by well known, for example, deposit and etch techniques to define the gate structure. Select gate 108 is disposed over a dielectric layer 112. Memory gate 110 is disposed over a charge trapping dielectric 114 having one or more dielectric layers. In one example, charge trapping dielectric 114 includes a charge trapping silicon nitride layer sandwiched between two silicon dioxide layers to create a three-layer stack collectively and commonly referred to as "ONO." Other charge trapping dielectrics may include a silicon-rich nitride film, or any film that includes, but is not limited to, silicon, oxygen, and nitrogen in various stoichiometries. A vertical dielectric 116 is also disposed between select gate 108 and memory gate 110 for electrical isolation between the two gates. In some examples, vertical dielectric 116 and charge trapping dielectric 114 are the same dielectric, while other examples form one dielectric before the other (e.g., they can have different dielectric properties.) As such, vertical dielectric 116 need not include the same film structure as charge trapping dielectric 114, regions 104 and 106 are created by implanting dopants using, for example, an ion implantation technique. Regions 104 and 106 form the source or drain of the split-gate transistor depending on what potentials are applied to each. In split gate transistors, for convenience, region 104 is commonly referred to as the drain, while region 106 is commonly referred to as the source, independent of the relative biases. It is to be understood that this description is meant to provide a general overview of a common split-gate architecture and that, in actual practice, many more detailed steps and layers are provided to form the final memory cell 100.

An example write, read, and erase operation will now be described as it relates to memory cell 100. In order to write a bit in memory cell 100, a positive voltage on the order of 5 volts, for example, is applied to region 106 while region 104 and substrate 102 are grounded. A low positive voltage on the order of 1.5 volts, for example, is applied to select gate 108 while a higher positive voltage on the order of 8 volts, for example, is applied to memory gate 110. As electrons are accelerated within a channel region between the source and drain, some of them will acquire sufficient energy to be injected upwards and get trapped inside charge trapping dielectric 114. This is known as hot electron injection. In one example of charge trapping dielectric 114, the electrons are trapped within a nitride layer of charge trapping dielectric 114. This nitride layer is also commonly referred to as the charge trapping layer. The trapped charge within charge trapping dielectric 114 store the "high" bit within memory cell 100, even after the various supply voltages are removed.

In order to "erase" the stored charge within memory cell 100 and return the state of memory cell 100 to a "low" bit, a positive voltage on the order of 5 volts, for example, is applied to region 106 while region 104 is floated or at a certain bias, and select gate 108 and substrate 102 are typically grounded. A high negative voltage on the order of −8 volts, for example, is applied to memory gate 110. The bias conditions between memory gate 110 and region 106 generate holes through band-to-band tunneling. The generated holes are sufficiently energized by the strong electric field under memory gate 110 and are injected upwards into charge trapping dielectric 114. The injected holes effectively erase the memory cell 100 to the "low" bit state.

In order to "read" the stored bit of memory cell 100, a low voltage is applied to each of the select gate, memory gate, and region 104 in the range between zero and three volts, for example, while region 106 and substrate 102 are typically grounded. The low voltage applied to the memory gate is chosen so that it lies substantially equidistant between the threshold voltage necessary to turn on the transistor when storing a "high" bit and the threshold voltage necessary to turn on the transistor when storing a "low" bit in order to clearly distinguish between the two states. For example, if the application of the low voltage during the "read" operation caused substantial current to flow between regions 104 and 106, then the memory cell holds a "low" bit and if the application of the low voltage during the "read" operation does not cause substantial current to flow between regions 104 and 106, then the memory cell holds a "high" bit.

Figure 2:
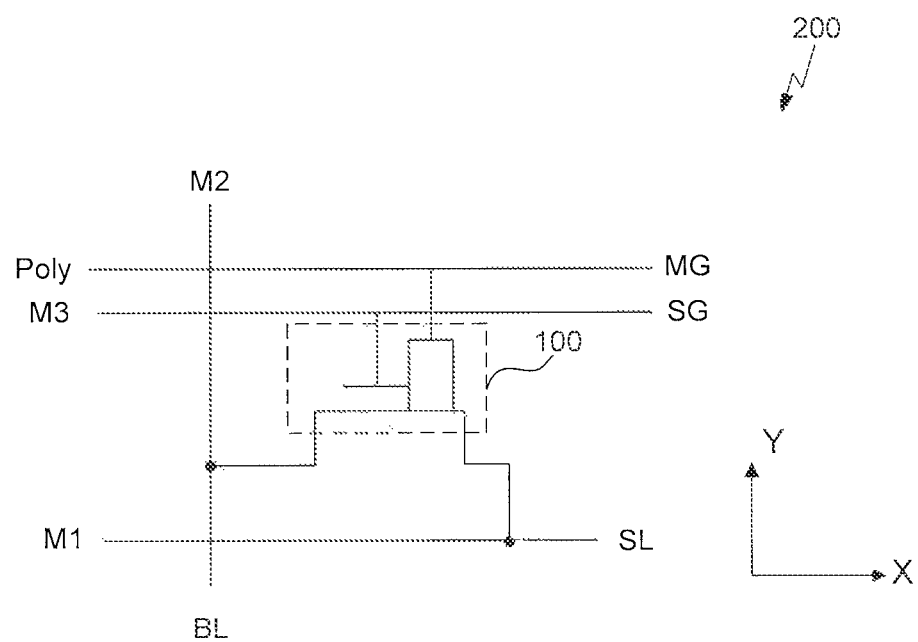
FIG. 2 is a circuit diagram of a memory cell in a memory array according to various embodiments.

FIG. 2 illustrates an example circuit diagram 200 that comprises a memory cell 100 including connections to various metal layers in a semiconductor device. Only a single memory cell 100 is illustrated, however, as evidenced by the ellipses in both the X and Y direction, an array of memory cells may be connected by the various lines running in both the X and Y directions. In this way, one or more memory cells 100 may be selected for reading, writing, and erasing bits based on the bit line (BL) and source line (SL) used.

An example source line (SL) runs along the X direction and is formed in a first metal layer (M1). Source line (SL) may be used to make electrical connection with doped region 106 of each memory cell 100 along a row extending in the X direction.

An example bit line (BL) runs along the Y direction and is formed in a second metal layer (M2). Bit line (BL) may be used to make electrical connection with doped region 104 of each memory cell 100 along a column extending in the Y direction.

It is to be understood that the circuit connections shown in FIG. 2 are only exemplary and that the various connections could be made in different metal layers than those illustrated. Furthermore, although not depicted, memory cells 100 may be arrayed in the Z direction as well formed within multiple stacked layers.

Figure 3:
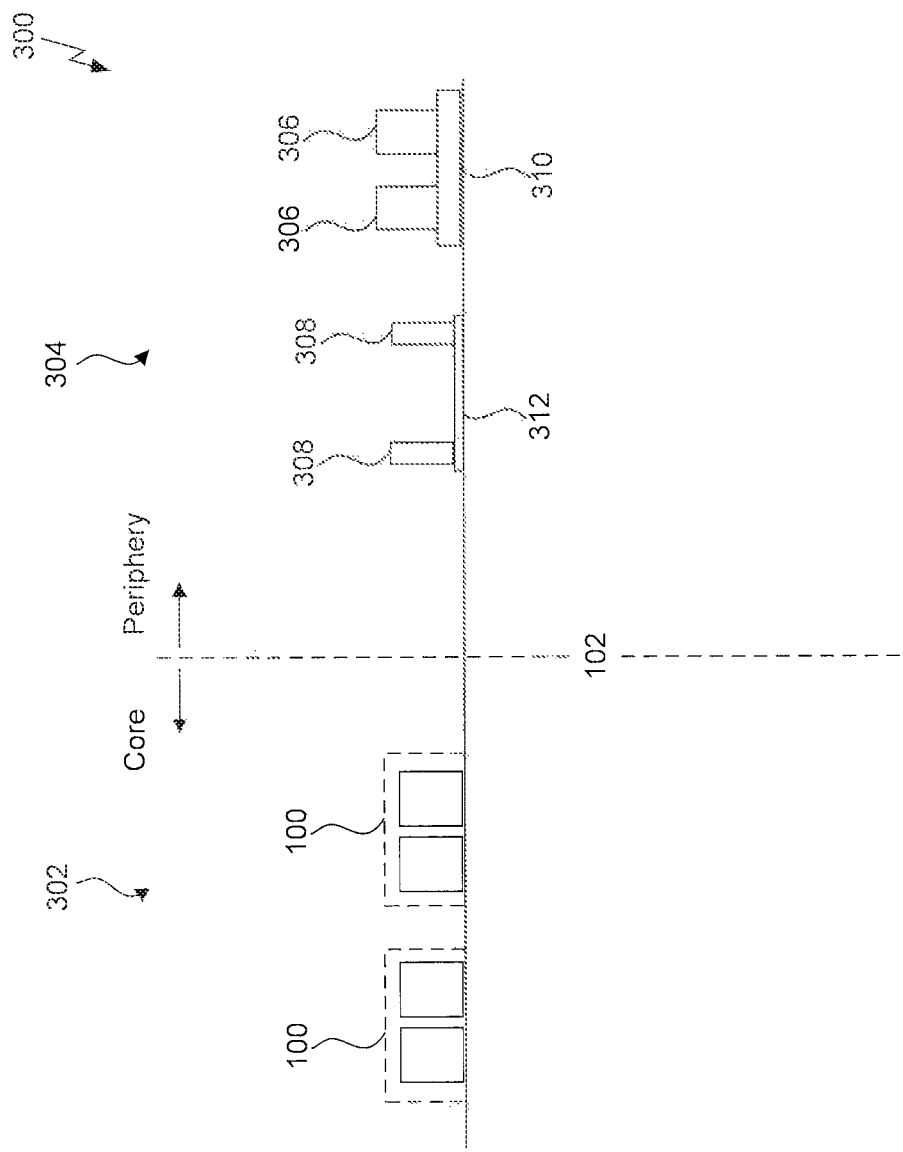
FIG. 3 depicts a cross-section of a semiconductor device according to various embodiments.

FIG. 3 illustrates an example semiconductor device 300 that includes both memory circuitry 302 and peripheral circuitry 304 in the same substrate 102, In this example, substrate 102 includes a core region 302 and a periphery region 304. Core region 302 includes a plurality of memory cells 100 that may operate similarly to those previously described. It should be understood that the cross-section of FIG. 3 is only exemplary, and that core region 302 and periphery region 304 may be located in any area of substrate 102 and may be made up of various different regions. Furthermore, core region 302 and periphery region 304 may exist in the same general area of substrate 102.

Substrate 302—and indeed substrates in general as used throughout the description—can be silicon according to various embodiments. However, the substrate 302 may also be any of a wide array of semiconductor materials such as germanium, gallium arsenide, indium phosphide, etc. In other embodiments, the substrate 302 may be electrically non-conductive such as a glass of sapphire wafer.

Periphery region 304 may include integrated circuit components such as resistors, capacitors, inductors, etc., as well as transistors. In the illustrated embodiment, periphery region 304 includes a plurality of high-voltage transistors 306 and low-voltage transistors 308. In one example, high-voltage transistors 306 exist in a separate region of substrate 102 than low-voltage transistors 308. High-voltage transistors 306 are capable of handling voltages up to 20 volts in magnitude, for example, while low-voltage transistors 308 operate at a faster speed, but cannot operate at the same high voltages as high-voltage transistors 306. In an embodiment, low voltage transistors 308 are designed to have a shorter gate length than high voltage transistors 306. High-voltage transistors 306 are commonly characterized as having a thicker gate dielectric 310 than the gate dielectric of low-voltage transistors 308. As shown in FIG. 3, low voltage transistors 308 have a narrower width than high-voltage transistors 306, but this need not be the case. According to some embodiments, low-voltage 308 transistors can be wider than high voltage transistors 306 or, alternatively, low-voltage transistors 308 and high-voltage transistors 306 can have the same width.

During the descriptions herein, various regions of the substrate upon which the field-effect devices are fabricated are mentioned. For instance, with respect to FIG. 3, core region 302 and periphery region 304 were described. It should be understood that these regions may exist anywhere on the substrate and furthermore that the regions may not be mutually exclusive. That is, in some embodiments, portions of one or more regions may overlap. Although up to three different regions are described herein, it should be understood that any number of regions may exist on the substrate and may designate areas having certain types of devices or materials. In general, the regions are used to conveniently describe areas of the substrate that include similar devices and should not limit the scope or spirit of the described embodiments.

Figure 4:
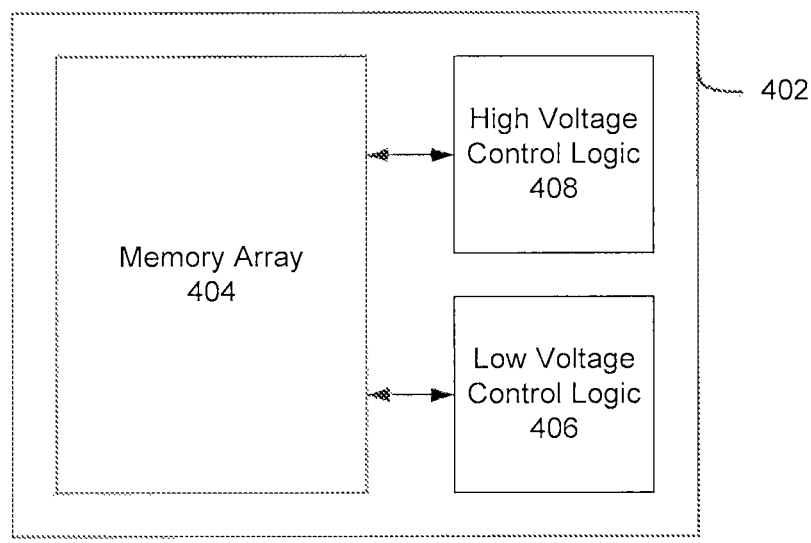
FIG. 4 is a functional block diagram of a memory device according to various embodiments.

FIG. 4 is a functional block diagram of a memory device 402 according to embodiments of the present invention. As shown, memory device 402 includes a memory array 404, high voltage control logic 408, and low voltage control logic 406. According to various embodiments, the memory array 404 may comprise a number of memory cells 100 and may be physically located in a core region 302 of memory device 402. High voltage control logic 408 may comprise a number of high-voltage transistors 306, which can be used to control and/or drive portions of the memory array 404. Additionally, the high voltage control logic 408 may be physically located in the periphery 304 of the memory device 402. Similarly to the high voltage control logic 408, the low voltage control logic 408 may comprise a number of low voltage transistors 308, which can be used to control and/or drive portions of the memory array 404. The low voltage control logic 406 may also be located in the periphery 304 of the memory device. According to various embodiments, the high voltage control logic 406 and the low voltage control logic 406 are located in different portions of the periphery region 304.

Figure 5B:
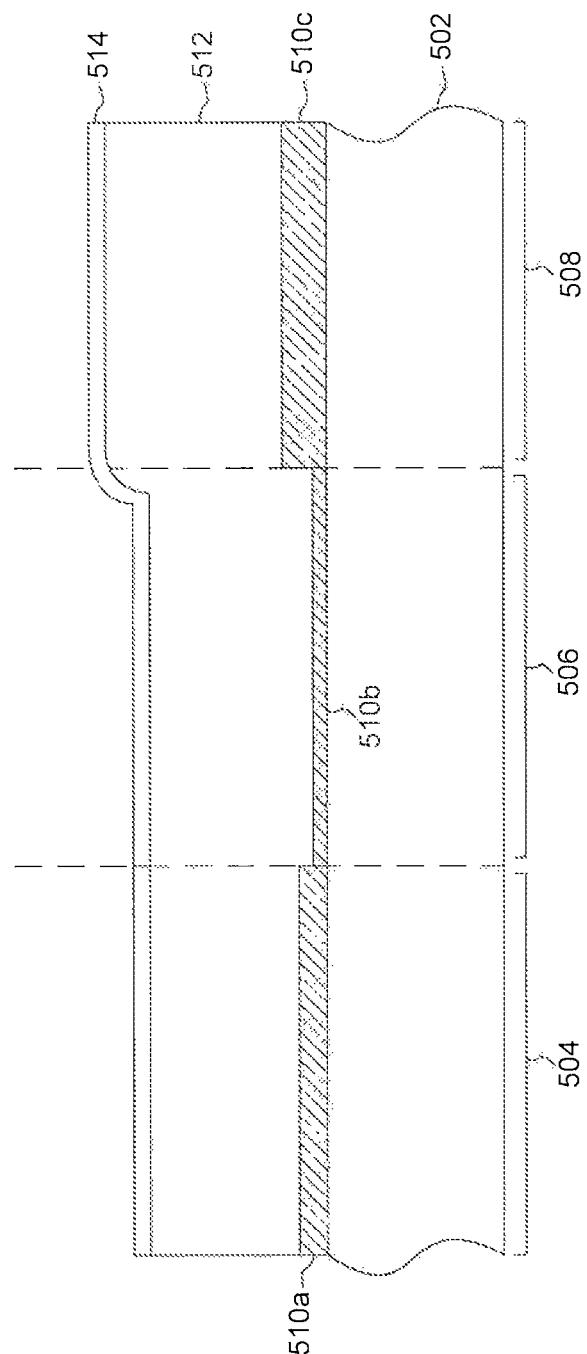

FIGS. 5A-5G depict a device 500 at various points during its manufacture according to embodiments of the invention. FIG. 5A depicts device 500 after certain preliminary steps. For instance, as shown in FIG. 5A, device 500 comprises a substrate 502 and is divided several regions 504, 506, and 508.

A first or memory region 504 of the substrate may be used for memory components. According to various embodiments, the first region 504 comprises a memory core region where a plurality memory cells (e.g., memory cell 100) can be formed. For instance, according to some embodiments, the first region may be used to form a number of split gate (e.g., split gate 108)/memory gate (e.g., memory gate 110) pairs.

Logic and/or control circuitry may be formed in periphery, which includes second and third regions 506 and 508, respectively according to various embodiments. The second region 506 may comprise low voltage control logic (e.g., region 406 in FIG. 4) and third region 508 may comprise high voltage control logic (e.g., region 408).

As shown in FIG. 5A, a gate dielectric 510a that is formed in first region 504 and gate dielectric 510b is formed in second region 506. According to various embodiments the gate dielectrics 510a and 510b may be different thicknesses as shown, but this need not be the case. The gate dielectrics can be any electrically material including but not limited to oxides, nitrides, or some combination thereof. The gate dielectrics 510a and 510b may be formed through any well-known method. For instance, the dielectrics may be grown on the substrate 502 and comprise an oxide of the substrate material (e.g., silicon oxide). It is also possible, however, for the gate dielectrics 510a and 510b to be disposed on the substrate and comprise an oxide of a different material than the substrate. Additionally, dielectrics 510a and 510b may comprise the same or different material and may be formed at the same time or at different times according to various embodiments. FIG. 5A also depicts a gate dielectric 510c formed in the third region 508. The gate dielectric 510c may be thicker than either of the of the gate dielectrics 510a and 510b according to some embodiments, but it also may be the same thickness as either or both of gate dielectrics 510a and 510b. Additionally, according to various embodiments, gate dielectrics 510a, 510b, and 510c may comprise a single continuous oxide layer.

FIG. 5B depicts a cross section of device 500 after the formation of a gate conductor 512. Any appropriate gate conductor material could be used to form the gate conductor 512 such as a poly, according to various embodiments. As shown, the gate conductor layer 512 is formed over the gate dielectrics 510a, 510b, and 510c. The gate conductor layer 512 may be formed or disposed according to any appropriate well-known method such as deposition. Deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others. Additionally, FIG. 5B depicts mask layer 514 disposed over the gate conductor layer 512. Mask layer 514 may comprise any suitable material that allows for selective removal (e.g., etching) of the unmasked portion of the gate conductor layer 512. According to some embodiments, masking structures may comprise a photoresist such as Poly(methyl methacrylate) (PMMA), Poly(methyl glutarimide) (PMGI), a Phenol formaldehyde resin, a suitable epoxy, etc. Additionally, the mask layer 514 may comprise a hardmask according to some embodiments.

FIG. 5C depicts a cross section of device 500 after mask layer 514 has been patterned in the first region 504 to create a select gate mask 516. Once the select gate mask 516 has been patterned, the unmasked portion of the gate conductor 512 may be removed using an appropriate method such as etching. The remaining select gate dielectric 510a is optionally removed after etching except the portion of the gate dielectric 512 disposed between the remaining gate conductor 512 and substrate 502.

Figure 5D:
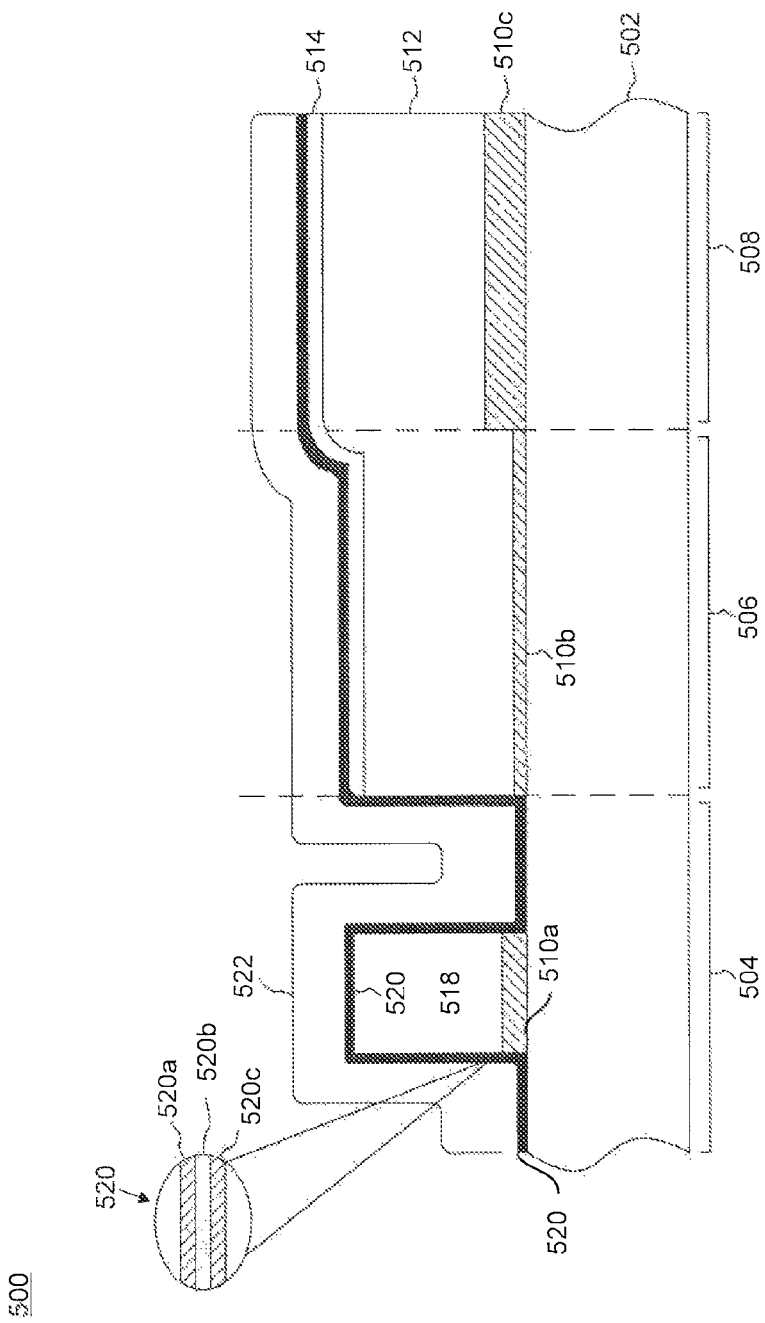

FIG. 5D depicts a cross section of device 500 after removal of the unmasked portion of the gate conductor 512 at region 504. As shown in FIG. 5D, charge trapping dielectric 520 is formed over all three regions 504, 506, and 508 of device 500. In FIG. 5D charge trapping dielectric 520 is depicted as being disposed conformally over device 500, but this need not be the case. According to various embodiments, the charge trapping dielectric 520 comprises one or more layers of dielectric such as ONO, as described above. For instance, the charge trapping dielectric 520 may comprise a first dielectric layer 520a, a charge trapping layer 520b, and a second dielectric layer 520c. First dielectric layer 520a and second dielectric layer 520c may each comprise a suitable dielectric such as oxide. Regardless of the specific composition of the charge trapping dielectric 520, it preferably contains at least one charge trapping layer 520b, but may include several as well. The charge trapping layer 520b may be formed silicon-rich nitride film, or any film that includes, but is not limited to, silicon, oxygen, and nitrogen in various stoichiometries, and may include multiple layers of different materials according to some embodiments.

FIG. 5D also depicts a second gate conductor, for example gate conductor layer 522 formed over the charge trapping layer 520. The second gate conductor 522 may be formed of any suitable conductor such as, for instance, poly. According to some embodiments, the second gate conductor layer 522 may be substantially conformal to the other structures formed on device 500, but this need not be this case in all embodiments. As will be seen, the second gate conductor layer 522 may be used to form a memory gate for a split-gate memory cell.

After deposition of the gate conductor layer 522, the second gate conductor layer 522 may be removed from all portions of the device 500 except from the sidewall of select gate 518 on its source side (e.g., region 106) according to a number of well-known methods. Additionally, the charge trapping layer 520 can be removed from the entire device 500 except for the portion that is disposed between the sidewall of the memory gate and the gate conductor layer 522 and the gate conductor layer 522 and a portion of substrate 502. The device after removal of these portions of the gate conductor layer 522 and the charge trapping dielectric 520 is depicted in FIG. 5E.

Figure 5E:
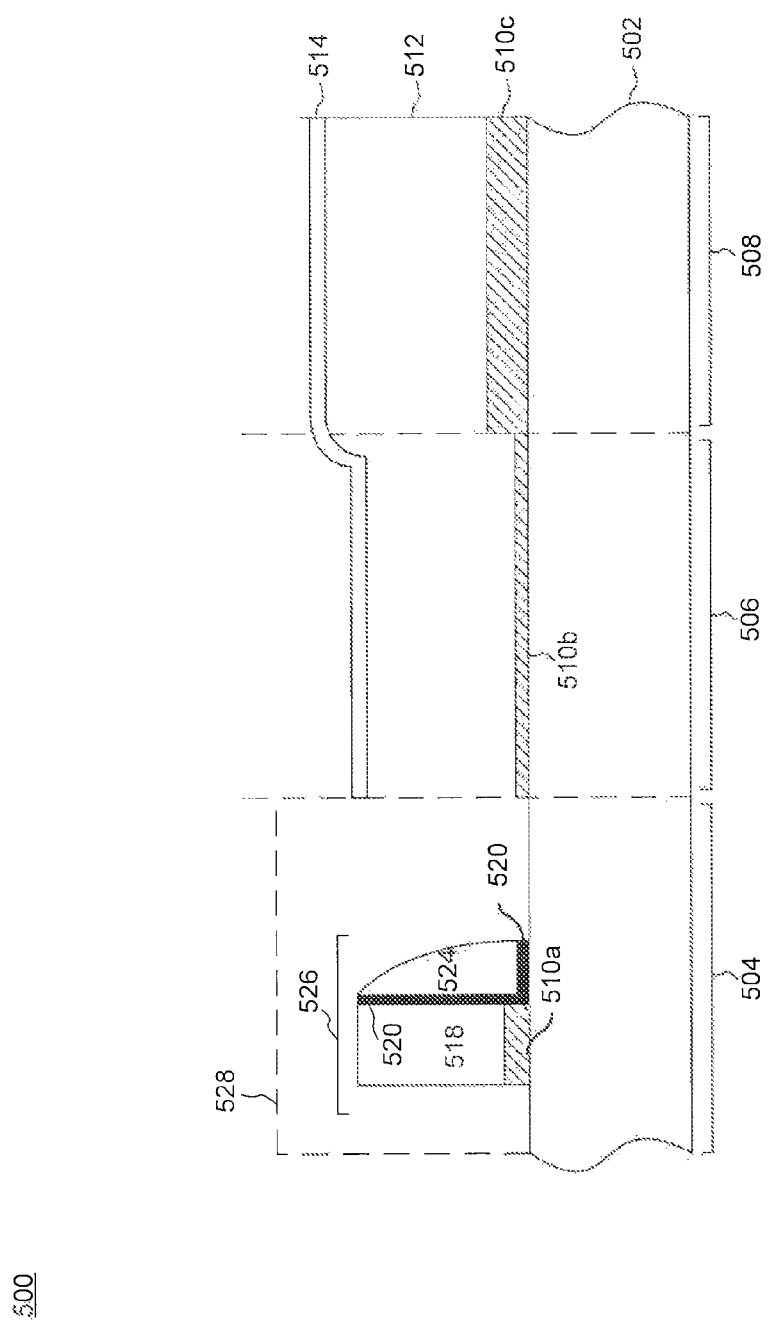

FIG. 5E depicts device 500 after the formation of memory cell 526 according to various embodiments. As can be seen, the un-removed portion of gate conductor layer 522 forms select gate 524. Additionally, the entire first region 504 may be masked by mask 528.

Figure 5F:
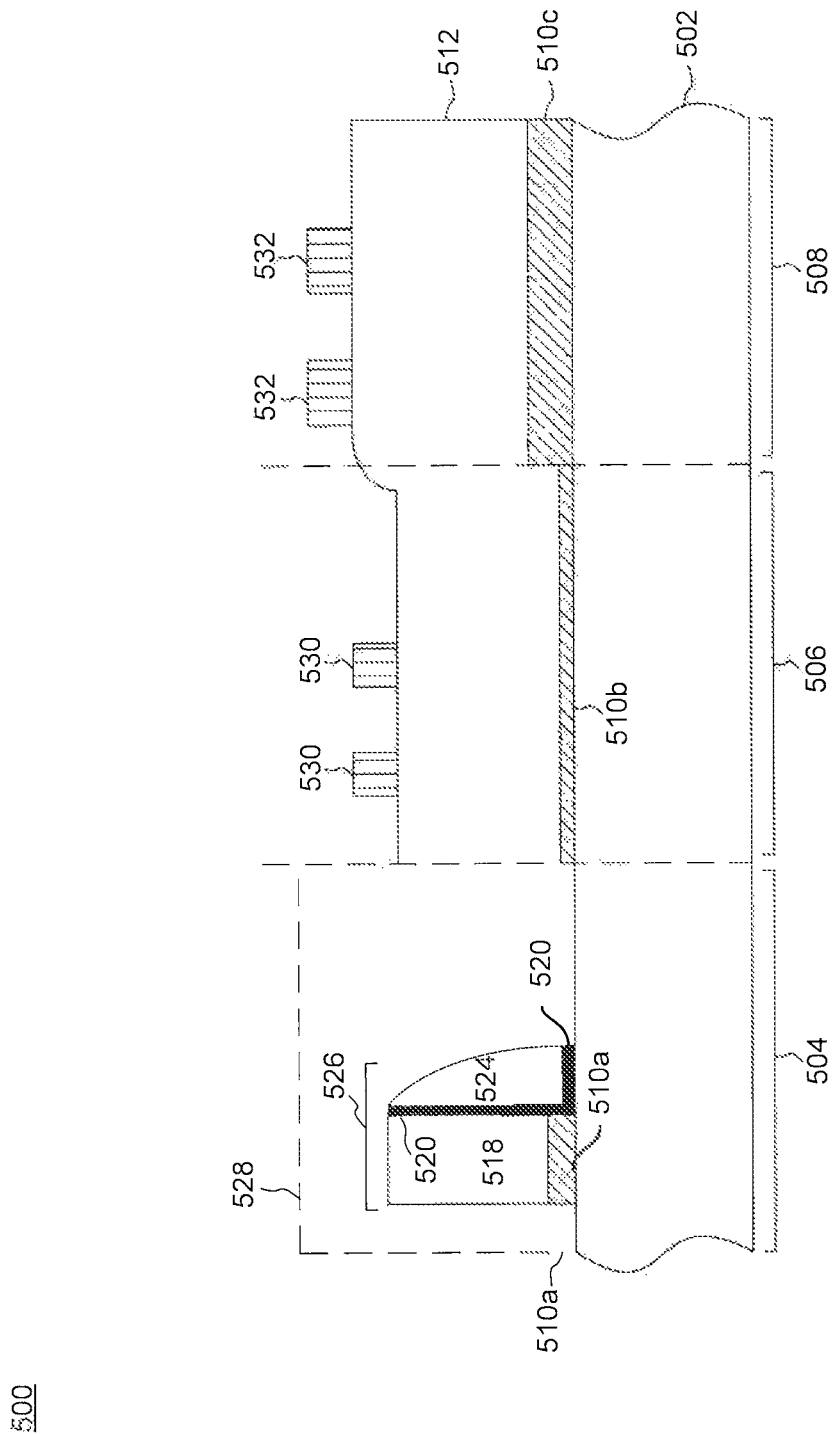

FIG. 5F depicts a cross section of device 500 after the formation of masks 530 in the second region 506 and masks 532 in the third region 508 according to various embodiments. Masks 530 and 532 may be formed by patterning mask 514 according to some embodiments, or may be separately formed over the remaining portion of the gate conductor region 512 disposed in the second and third regions 506 and 508. According to some embodiments, masks 530 and 532 are used to define logic gates in the second region and the third region 506 and 508, respectively. Since it can be desirable form gates in the two regions 506 and 508 using different technology nodes, it can be desirable to use masks 530 and 532 having different dimensions from each other according to various embodiments.

Figure 5G:
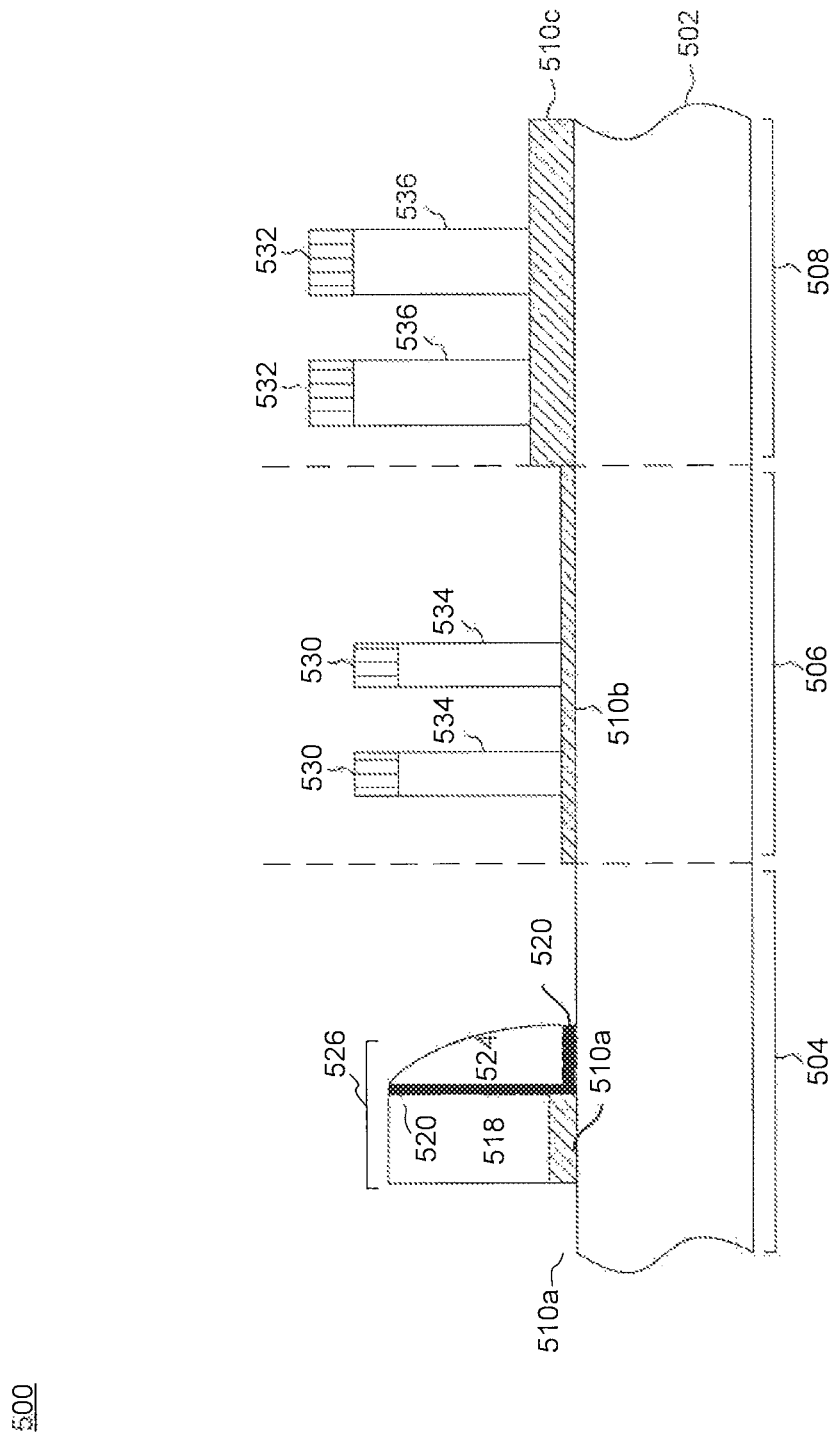

FIG. 5G depicts a cross section of device 500 after the removal of the unmasked portion of gate conductor 512 from the second region 506 and the third region 508 in order to define logic gates 534 and 536. According to some embodiments, this can be accomplished by first masking the third region 508 and etching the second region 506 to define logic gates 534. The mask could then be removed from the third region and one added to the second region and the third region could be etched to define logic gates 536.

It should be appreciated that each of the structures formed in regions 504, 506, and 508 can be formed according to various technologies and/or processes. For instance, according to some embodiments the formation of the split-gate memory cell 526 in the first region 504 may employ a process with a much longer gate length (e.g., 90 nm) than the gate length of the process employed to manufacture the logic gates 534 or 536 in the second and third regions.

According to various embodiments, the structures in regions 504, 506, and 508 may be formed using different processes and/or technology nodes. The term "technology node" refers broadly to the size of elements (e.g., gate lengths) in a semiconducting device. For instance, semiconductor device components manufactured using a 330 nm technology node might all have a size that roughly corresponds to 330 nm. However, they need not be exactly the dimension of the node to be categorized as such. For instance, in some cases, a manufacturing process that produces device elements around 225 nm in size, might still be considered to be a process that employs a 330 nm technology node. Because each "node" is understood to include a range of dimensions, technology nodes are often referred to without reference to the least significant digit—i.e., 330 nm technology node might be referred to as the "33×nm node." According to various embodiments, the technology nodes used to produce each of the elements in the first region 504, the second region 506, and the third region 508 may be chosen from one of 33×nm, 25×nm, 23×nm, 17×nm, 13×nm, 11×nm, 9×nm, 6×nm, 5×nm, 4×nm, 3×nm, 2×nm, and 1×nm.

It should be understood, that FIGS. 5A-5G depict a simplified version of device 500 with only a single memory cell 526 and a pair of single logic gates 534 and 536 in each of the second region 506 and the third region 508 for ease of explanation. A person of ordinary skill in the art, however, would understand that device 500 could contain a large number of memory cells, logic cells, and other components in each of the first region 504, second region 506, and third region 508.

For simplicity's sake, FIGS. 5A-5G do not expressly depict source and drain regions in device 500. However, it should be understood that appropriate source and drain regions (e.g., regions 104 and 106) would be formed in device 500 during the manufacturing process by any appropriate method such as ion implantation, for example.

Figure 6:
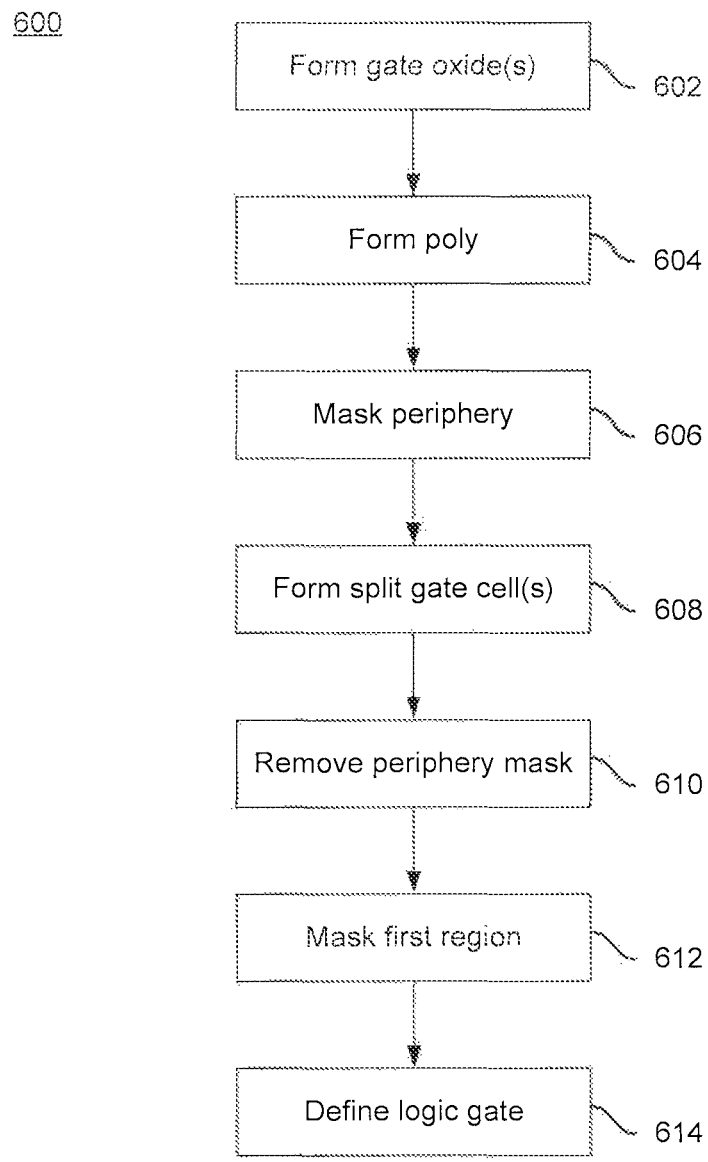
FIG. 6 is a flowchart depicting a method of manufacturing a semiconductor device according to various embodiments.

FIG. 6 depicts a method 600 of manufacturing a semiconductor device (e.g., device 500) according to various embodiments. The discussion of FIG. 6 will make reference to FIGS. 5A-5G to aid clarity; however it should be understood that method 600 is not limited to the specific embodiments depicted in FIGS. 5A-5G, but is more generally applicable.

As shown in FIG. 6, the method 600 may begin at step 602 by forming a gate dielectric over a substrate 502. The gate dielectric formed in step 602 may be formed as one continuous layer over each of the first region 504, the second region 506, and the third region 508. However, it is also possible to form separate dielectric layers in each of the regions 504, 506, and 508. For instance, a first gate dielectric layer 510a may be formed in the first region 504, a second gate dielectric layer 510b may be formed in the second region, and a third gate dielectric layer 510c may be formed in the third region 508. According to some embodiments, the thickness of the dielectric 510a, 510b, and 510c can be chosen based on the desired thickness of the gate dielectric for that region. The gate dielectrics 510a, 510b, and 510c may be formed through any well-known method. For instance, the dielectrics may be grown on the substrate 502 and comprise an dielectric of the substrate material (e.g., silicon oxide). It is also possible, however, for the gate dielectrics 510a, 510b, and 510c to be disposed on the substrate and comprise an oxide of a different material than the substrate. Additionally, dielectrics 510a, 510b, and 510c may comprise the same or different material and may be formed at the same time or at different times according to various embodiments. The gate dielectric 510c may be thicker than either of the of the gate dielectrics 510a and 510b and gate dielectric 510a may be thinner than gate dielectric 510c according to some embodiments.

At step 604, a gate conductor, for example gate conductor layer 512, is disposed over the dielectric layers 510a, 510b, and 510c. The gate conductor layer 512 may be disposed or deposited according to any appropriate well-known method such as deposition. Deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

At step 606, the periphery regions (i.e., regions 506 and 508) are masked with masking layer 514. According to some embodiments, the masking layer 514 is formed over each of the three regions 504, 506, and 508, and then patterned in the first region to form select gate masks 516. Mask layer 514 may comprise any suitable material that allows for selective removal (e.g., etching) of the unmasked portion of the gate conductor layer 512. According to some embodiments, masking structures may comprise a photoresist such as Poly(methyl methacrylate) (PMMA), Poly(methyl glutarimide) (PMGI), a Phenol formaldehyde resin, a suitable epoxy, etc. Additionally, the mask layer 514 may comprise a hardmask according to some embodiments.

At step 608, one or more split gates 518 can be formed in the first region 504 by removing a portion of the gate conductor layer 512. For instance, select gate masks 516 may be used to define the select gates 518 and the gate conductor layer 512 etched away according to some embodiments.

At step 610 optionally some or all of the periphery mask 514 can be removed. For instance, the periphery mask could be patterned to form masks 530 and 532 in the second and third regions 506 and 508 according to some embodiments. Alternatively the entirety of the periphery mask 514 can be removed. At step 612, the first region 504 can be masked using mask 528 in order to protect it from the process flow used to produce structures (e.g., logic gates) in the periphery. At step 614, a logic gate (e.g., 534 or 536) can be defined in one of the periphery regions 506 or 508. Additionally, several logic gates may be defined in each of the periphery regions 506 and 508 at the same time According to various embodiments, the logic gates 534 or 536 can be defined by patterning the periphery mask at step 610 to form logic gate masks (e.g., masks 530 and 532) and then removing the gate conductor 512 from the periphery regions 506 and 508 by, e.g., etching. According to some embodiments, the periphery mask is entirely removed at step 610. Accordingly, the logic gate(s) can be defined by forming masks 530 and 532 in the second and third regions 506 and 508 and then removing the unmasked portion of gate conductor 512 though, e.g., etching.

Figure 7:
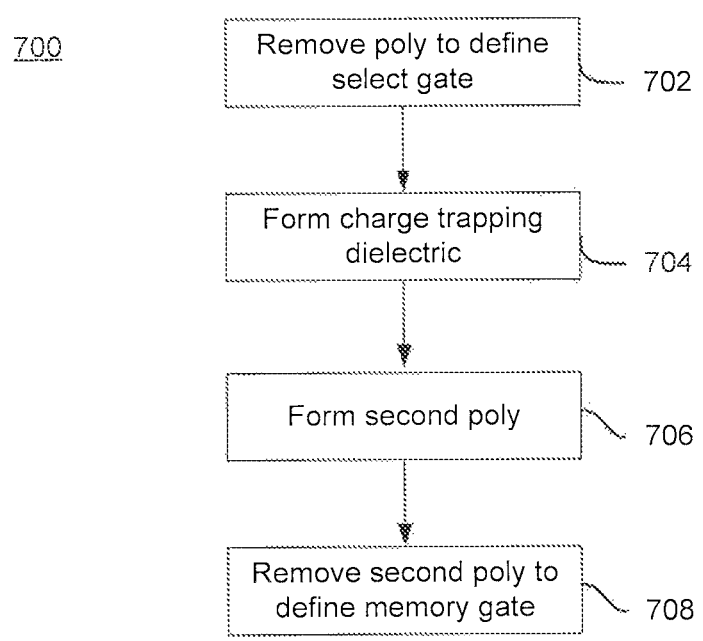
FIG. 7 is a flowchart depicting a method of manufacturing a semiconductor device according to various embodiments.

FIG. 7 depicts a method 700 of forming a split-gate memory cell 526 in the first region 504 of device 500 according to embodiments. The discussion of FIG. 7 will make reference to FIGS. 5A-5G to aid clarity; however it should be understood that method 700 is not limited to the specific embodiments depicted in FIGS. 5A-5G, but is more generally applicable.

As shown in FIG. 7, the method 700 begins at step 702 by removing a portion of a first gate conductor layer 512 to define a select gate 518 in the first region 504 of the device 500. A charge trapping dielectric 520 can be formed at step 704. Charge trapping dielectric 520 may be formed over all three regions 504, 506, and 508 of device 500 according to some embodiments. Additionally, charge trapping layer 520 may be disposed conformally over device 500, but this need not be the case. According to various embodiments, the charge trapping dielectric 520 comprises one or more layers of dielectric such as ONO, as described above. For instance, the charge trapping dielectric 520 may comprise a first dielectric layer 520a, a charge trapping layer 520b, and a second dielectric layer 520c. Regardless of the specific composition of the charge trapping dielectric 520, it preferably contains at least one charge trapping layer 520b, but may include several as well. The charge trapping layer 520b may be formed of silicon-rich nitride film, or any film that includes, but is not limited to, silicon, oxygen, and nitrogen in various stoichiometries, and may include multiple layers of different materials according to some embodiments.

At step 706, a second gate conductor, for example gate conductor layer 522, can be formed. The gate conductor layer 522 may be disposed or deposited according to any appropriate well-known method such as deposition. Deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

At step 708, a portion of the second gate conductor layer 522 is removed to form a memory gate 524. According to various embodiments, the second gate conductor layer 522 may be removed from all portions of the device 500 except from the sidewall of select gate 518 on its source side (e.g., region 106) according to a number of well-known methods. Additionally, the charge trapping layer 520 can be removed from the entire device 500 except for the portion that is disposed between the sidewall of the memory gate and the gate conductor layer 522 and the gate conductor layer 522 and a portion of substrate 502.

Figure 8:
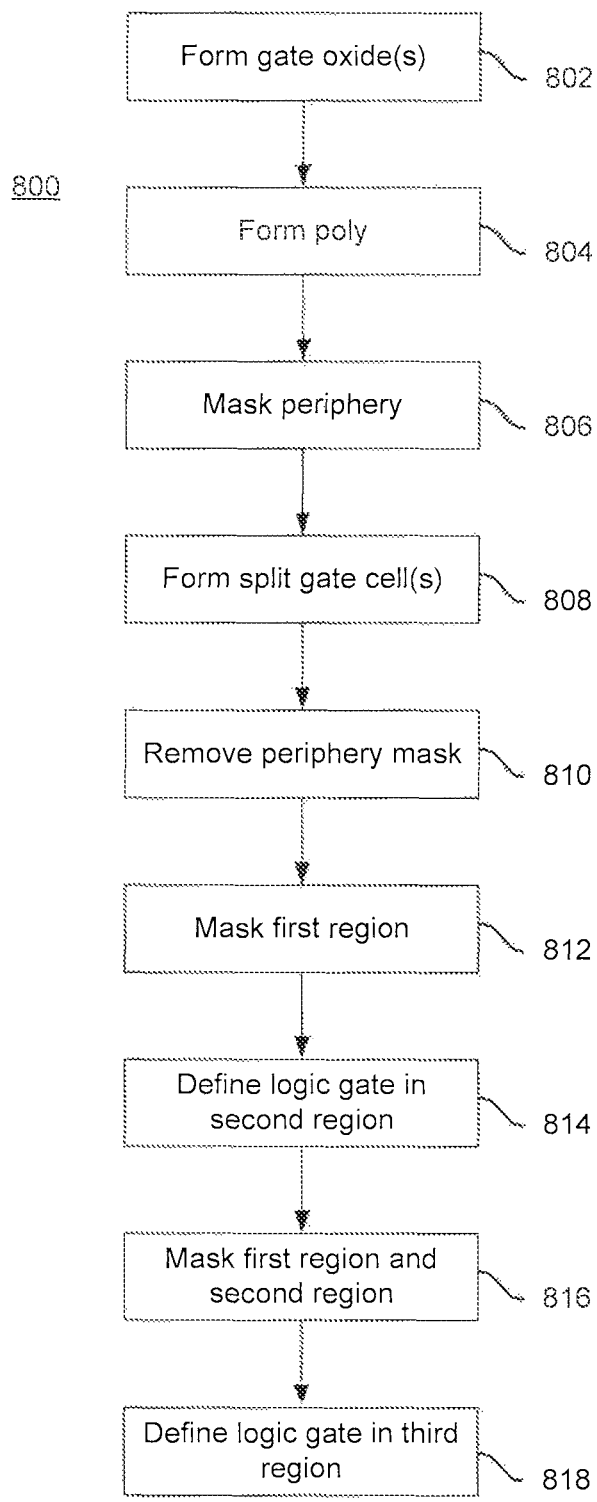
FIG. 8 is a flowchart depicting a method of manufacturing a semiconductor device according to various embodiments.

FIG. 8 depicts a method 800 of manufacturing a semiconductor device (e.g., device 500) according to various embodiments. The discussion of FIG. 8 will make reference to FIGS. 5A-5G to aid clarity; however it should be understood that method 800 is not limited to the specific embodiments depicted in FIGS. 5A-5G, but is more generally applicable.

As shown in FIG. 8, the method 800 may begin at step 802 by forming a gate dielectric over a substrate 502. The gate dielectric formed in step 802 may be formed as one continuous layer over each of the first region 504, the second region 506, and the third region 508. However, it is also possible to form separate dielectric layers in each of the regions 504, 506, and 508. For instance, a first gate dielectric layer 510a may be formed in the first region 504, a second gate dielectric layer 510b may be formed in the second region, and a third gate dielectric layer 510c may be formed in the third region 508. According to some embodiments, the thickness of the dielectric 510a, 510b, and 510c can be chosen based on the desired thickness of the gate dielectric for that region. The gate dielectrics 510a, 510b, and 510c may be formed through any well-known method. For instance, the dielectrics may be grown on the substrate 502 and comprise an oxide of the substrate material (e.g., silicon oxide). It is also possible, however, for the gate dielectrics 510a, 510b, and 510c to be disposed on the substrate and comprise an oxide of a different material than the substrate. Additionally, dielectrics 510a, 510b, and 510c may comprise the same or different material and may be formed at the same time or at different times according to various embodiments. The gate dielectric 510c may be thinner than either of the gate dielectrics 510a and 510b and gate dielectric 510a may be thinner than gate dielectric 510b according to some embodiments.

At step 804, first gate conductor, for example gate conductor layer 512, is disposed over the dielectric layers 510a, 510b, and 510c. The gate conductor layer 512 may be disposed or deposited according to any appropriate well-known method such as deposition. Deposition can comprise any process that grows, coats, or transfers material onto a substrate. Some well-known technologies include physical vapor deposition (PVD), chemical vapor deposition (CVD), electrochemical deposition (ECD), molecular beam epitaxy (MBE), atomic layer deposition (ALD), and plasma-enhanced CVD (PECVD), amongst others.

At step 806, the periphery regions (i.e., regions 506 and 508) are masked with masking, layer 514. According to some embodiments, the masking layer 514 is formed over each of the three regions 504, 506, and 508, and then patterned in the first region to form select gate masks 516. Mask layer 514 may comprise any suitable material that allows for selective removal (e.g., etching) of the unmasked portion of the gate conductor layer 512. According to some embodiments, masking structures may comprise a photoresist such as Poly(methyl methacrylate) (PMMA), Poly(methyl glutarimicle) (PMGI), a Phenol formaldehyde resin, a suitable epoxy, etc. Additionally, the mask layer 514 may comprise a hardmask according to some embodiments.

At step 808, one or more split gates 518 can be formed in the first region 504 by removing a portion of the gate conductor layer 512. For instance, select gate masks 516 may be used to define the select gates 518 and the gate conductor layer 512 etched away according to some embodiments.

At step 810 some or all of the periphery mask 514 can be removed. For instance, the periphery mask could be patterned to form masks 530 and 532 in the second and third regions 506 and 508 according to some embodiments. Alternatively the entirety of the periphery mask 514 can be removed.

At step 812, the first region can be masked to protect it from the process steps required to manufacture structures (e.g., logic gates 534 and 536) in the periphery regions 506 and 508. It is also possible to mask the third region 508 at this point according to some embodiments.

At step 814, a logic gate 534 can be defined second regions 506. Additionally, several logic gates 534 may be defined in second regions 506. According to various embodiments, the logic gates 534 can be defined by patterning the periphery mask at step 810 to form logic gate masks (e.g., masks 530) and then removing the gate conductor 512 from the second region 506 by, e.g., etching. According to some embodiments, the periphery mask is entirely removed at step 810. Accordingly, the logic gate(s) can be defined by forming masks 530 in second region 506 and then removing the unmasked portion of gate conductor 512 though, e.g., etching.

At step 816, the second region 506 can be masked along with the first region 504, which can be already masked at this point according to various embodiments. By masking the first region 504 and the second region 506, the structures formed in those regions (e.g., split gate memory cell(s) 526 and gates 534) are protected from the process of manufacturing structures (e.g., gates 536) in the third region.

At step 818, a logic gate 536 can be defined third region 508. Additionally, several logic gates 536 may be defined in the third region 508. According to various embodiments, the logic gates 536 can be defined by patterning the periphery mask at step 810 to form logic gate masks (e.g., masks 532) and then removing the gate conductor 512 from the third region 508 by e.g., etching. According to some embodiments, the periphery mask 514 is entirely removed at step 810. Accordingly, the logic gate(s) 536 can be defined by forming masks 532 over the third regions and then removing the unmasked portion of gate conductor 512 though, e.g., etching.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

Embodiments of the present invention have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning, and range of equivalents of the disclosed embodiments, based on the teaching and guidance presented herein. It is to be understood that the phraseology or terminology herein is for the purpose of description and not of limitation, such that the terminology or phraseology of the present, specification is to be interpreted by the skilled artisan in light of the teachings and guidance. Additionally, it should be understood that none of the examples or explanations contained herein are meant to convey that the described embodiments have been actually reduced to practice.

The breadth and scope of the present invention should not be limited by any of the above-described exemplary embodiments, but should be defined only in accordance with the following claims and their equivalents.

What is claimed is:

1. A method of making a semiconductor device, comprising:
    forming a dielectric layer at a first region and a second region of a semiconductor substrate;
    disposing a gate conductor layer over the dielectric layer formed in the first and second regions of the semiconductor substrate;
    disposing a first mask layer over the first and second regions;
    patterning the first mask layer to form a select gate mask only in the first region;
    forming a split gate memory cell in the first region of the semiconductor substrate, wherein the split gate memory cell has a first gate length, wherein forming the split gate gate memory cell comprises etching the gate conductor layer, using the select gate mask, to define a select gate and disposing a charge trapping dielectric in contact with a top portion of the select gate; disposing a second mask layer in contact with the select gate in the first region; and etching the second region to define a logic gate, wherein the logic gate has a second gate length, wherein disposing the first mask layer on the second region comprises disposing a hard mask layer over the first region, wherein the hard mask layer over the first region is different from the second mask layer over the first region.

2. The method of claim 1, wherein forming the dielectric layer comprises forming a first dielectric layer in the first region and a second dielectric layer in the logic region.

3. The method of claim 2, wherein the second dielectric layer is thicker than the first dielectric layer.

4. The method to claim 1, wherein the hard mask layer comprises more than one dielectric film.

5. The method of claim 1, further comprising:
   masking the first region and the second region; and
   etching a third region to define a second logic gate having a third gate length.

6. The method of claim 5, wherein forming the dielectric layer comprises forming a third dielectric layer in the third region.

7. The method of claim 1, wherein forming the split gate memory cell comprises:
   disposing a second gate conductor layer over the charge trapping dielectric; and
   etching the second gate conductor layer to define a memory gate adjacent to the select gate.

8. The method of claim 7, wherein disposing the charge trapping dielectric comprises:
   disposing an dielectric layer; and
   disposing a nitride layer.

9. The method of claim 1, wherein the first gate length is greater than the second gate length.

10. A method of making a memory cell and a logic gate on a semiconductor substrate, the method comprising:
    forming a dielectric layer in a first region and a second region of the semiconductor substrate;
    disposing a gate conductor layer over the dielectric layer;
    forming a select gate mask in the first region;
    removing one or more regions adjacent to the select gate mask in the first region;
    disposing a charge dielectric layer over the first and second regions;
    forming a gate structure for the memory cell in the first region, wherein forming the gate structure comprises:
       removing the charge dielectric layer over the second region; and
       patterning the charge dielectric layer in the first region, wherein the patterning comprises forming a select gate for the memory cell and forming the charge dielectric layer in contact with a top portion of the select gate;
    disposing a mask layer in contact with the select gate in the first region, wherein the mask layer is different from the select gate mask; and
    forming a logic gate in the second region after removal of the charge dielectric layer over the second region.

11. The method of claim 10, further comprising:
    disposing the charge dielectric layer over a third region of the semiconductor substrate; and
    forming another logic gate in the third region after removal of the charge dielectric layer over the second and third regions.

12. The method of claim 11, wherein the logic gate and the another logic gate have different dimensions from each other.

13. The method of claim 10, wherein the memory cell comprises a split gate memory cell.

14. The method of claim 10, wherein disposing the gate conductor layer comprises disposing the gate conductor layer at different thicknesses between the first and second regions.

15. The method of claim 10, wherein forming the select gate mask comprises disposing another mask layer over the first and second regions.

16. The method of claim 10, wherein patterning the charge dielectric layer in the first region comprises etching an unmasked portion of the gate conductor layer.

17. The method of claim 10, wherein forming the logic gate comprises masking the gate structure for the memory cell and surrounding areas of the gate structure in the first region.

18. The method of claim 10, wherein forming the logic gate comprises patterning a mask in the second region after a mask has been disposed over the gate structure for the memory cell and surrounding areas of the gate structure in the first region.

* * * * *